(12) United States Patent
Lin

(10) Patent No.: US 9,475,156 B2
(45) Date of Patent: Oct. 25, 2016

(54) HEAT-DISSIPATION UNIT AND METHOD OF MANUFACTURING SAME

(71) Applicant: Asia Vital Components Co., Ltd., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 154 days.

(21) Appl. No.: 14/327,248

(22) Filed: Jul. 9, 2014

(65) Prior Publication Data

US 2014/0317928 A1    Oct. 30, 2014

Related U.S. Application Data

(62) Division of application No. 13/454,602, filed on Apr. 24, 2012, now abandoned.

(51) Int. Cl.
| | |
|---|---|
| *B23P 15/26* | (2006.01) |
| *H01L 23/367* | (2006.01) |
| *H01L 21/48* | (2006.01) |
| *B23P 11/00* | (2006.01) |

(52) U.S. Cl.
CPC ............... *B23P 15/26* (2013.01); *B23P 11/00* (2013.01); *H01L 21/4882* (2013.01); *H01L 23/3672* (2013.01); *B23P 2700/10* (2013.01); *H01L 2924/0002* (2013.01); *Y10T 29/4935* (2015.01)

(58) Field of Classification Search
CPC B23P 15/26; B23P 2700/10; Y10T 29/4935; Y10T 29/49915; Y10T 29/49917; Y10T 29/49925; H05K 7/20154; H05K 7/20163; H05K 7/20409; H05K 7/20418; H05K 7/20909; H05K 7/20918; H05K 2201/066
See application file for complete search history.

(56) References Cited

U.S. PATENT DOCUMENTS

| | | | |
|---|---|---|---|
| 3,077,928 A | * | 2/1963 | Nihlen .................... B21C 37/26 165/180 |
| 5,819,407 A | | 10/1998 | Terada |
| 6,085,830 A | | 7/2000 | Mashiko et al. |
| 6,263,956 B1 | | 7/2001 | Tang et al. |
| 6,742,581 B2 | | 6/2004 | Mochizuki et al. |
| 6,776,224 B1 | | 8/2004 | Chen |

(Continued)

FOREIGN PATENT DOCUMENTS

| | | |
|---|---|---|
| CN | 201555493 U | 8/2010 |
| CN | 201821625 U | 5/2011 |

(Continued)

OTHER PUBLICATIONS

Translation of Japanese Patent Publication JP 2006148162 A named JP2006148162.

*Primary Examiner* — Jason L Vaughan
(74) *Attorney, Agent, or Firm* — C. G. Mersereau; Nikolai & Mersereau, P.A.

(57) ABSTRACT

A heat-dissipation unit includes a base and a plurality of radiating fins. The base has a plurality of grooves formed thereon, and each of the grooves has an open top and closed bottom. The radiating fins respectively have a heat-radiating zone and a bent zone. When a pressure is applied onto the bent zones, the bent zones respectively form an assembling section in the grooves to tightly fit therein. With the above arrangements, the radiating fins can be firmly locked to the base without the need of welding, so that the manufacturing cost is reduced and the problem of a damaged base due to assembling can be avoided. A method of manufacturing the above-described heat-dissipation unit is also disclosed.

5 Claims, 10 Drawing Sheets

(56) References Cited

U.S. PATENT DOCUMENTS

| | | |
|---|---|---|
| 7,286,352 B2 | 10/2007 | Curtis et al. |
| 2002/0005248 A1 | 1/2002 | Gailus et al. |
| 2002/0070005 A1 | 6/2002 | Kawabata et al. |
| 2003/0094275 A1 | 5/2003 | Mochizuki et al. |
| 2010/0263850 A1* | 10/2010 | Huang .................. F28F 3/02 165/185 |

FOREIGN PATENT DOCUMENTS

| | | |
|---|---|---|
| JP | 200243477 A | 8/2000 |
| JP | 2006148162 A | 6/2006 |
| JP | 2008251568 A | 10/2008 |
| TW | M432866 U1 | 5/2001 |
| TW | 200719127 | 5/2007 |
| TW | 201200745 A1 | 1/2012 |

* cited by examiner

HEAT-DISSIPATION UNIT AND METHOD OF MANUFACTURING SAME

CROSS-REFERENCE TO RELATED APPLICATIONS

The present application is a division of U.S. patent application Ser. No. 13/454,602, filed on Apr. 24, 2012, titled Heat-Dissipation Unit and Method of Manufacturing Same, listing Sheng-Huang Lin as inventor.

FIELD OF THE INVENTION

The present invention relates to a heat-dissipation unit and a method of manufacturing same; and more particularly to a heat-dissipation unit and a method of manufacturing same that enables more firmly locking of radiating fins to a base at reduced manufacturing cost without causing the problem of a damaged base.

BACKGROUND OF THE INVENTION

An electronic element in an electronic device, such as, for example, a central processing unit, usually produces a large amount of heat during operation thereof and accordingly has a raised temperature. In the case the produced heat is not properly dissipated, it will cause overheat and unstable operation of the electronic element to result in stop or even crash of the whole electronic device. Meanwhile, with the constantly increased operating speed of various kinds of electronic elements, the heat produced by them also largely increases. Thus, the heat sink employed in the electronic device for dissipating the produced heat becomes more and more important.

Conventional heat sinks can be classified into two major types, namely, an integrally formed heat sink and an assembled heat sink formed from a plurality of stacked radiating fins. The radiating fins are bent at respective one edge to form connecting sections, which are welded to a base so that the radiating fins are connected to the base to form the heat sink. The welding of the radiating fins to the base results in complicated assembling procedures and does not meet the current requirement for environmental protection. Therefore, there were manufacturers who provide an insertion-type heat sink by inserting the radiating fins onto the base. The conventional insertion-type heat sink 1 usually includes a base 10 and a plurality of radiating fins 11. The base 10 is formed on one face with a plurality of grooves 101, into which the radiating fins 11 are inserted. According to the currently available technical skills, there are generally two ways for fixedly connecting the radiating fins 11 to the base 10. As shown in FIG. 1A, the first way is to directly weld the radiating fins 11 to the base 10, and in this way the welding will result in increased manufacturing cost. The second way is shown in FIG. 1B, in which the connecting sections 111 of the radiating fins 11 are first loosely fitted in the grooves 101 formed on the base 10, and then a tool 12 is used to punch against areas on the base between any two adjacent grooves 101, such that open tops of the grooves 101 are deformed to clamp on the connecting sections 111 of the radiating fins 11 in a tight-fit manner, as shown in FIG. 1C. However, while the deformed open tops of the grooves 101 clamp on the connecting sections 111 of the radiating fins 11 in a tight-fit manner, all other portions of the connecting sections 111 below the deformed open tops of the grooves 101 are still inserted in the grooves 101 in the loose-fit manner. Therefore, the connection of the radiating fins 11 to the base 10 in the second way tends to cause thermal resistance and easy separation of the radiating fins 11 from the grooves 101.

Accordingly, the conventional heat-dissipation units have the following disadvantages: (1) requiring increased manufacturing cost; (2) tending to have a deformed base; and (3) having a relatively unstable structure.

It is therefore tried by the inventor to develop an improved heat-dissipation unit and a method of manufacturing same, so as to overcome the problems in the prior art.

SUMMARY OF THE INVENTION

A primary object of the present invention is to provide a heat-dissipation unit that has radiating fins firmly locked to a base and can be manufactured at reduced cost.

Another object of the present invention is to provide a heat-dissipation unit that avoids the problem of a deformed base thereof.

A further object of the present invention is to provide a heat-dissipation unit manufacturing method, which enables a plurality of radiating fins to firmly lock to a base to form a heat-dissipation unit at reduced manufacturing cost.

To achieve the above and other objects, the heat-dissipation unit provided according to the present invention includes a base and a plurality of radiating fins. The base has a plurality of grooves formed thereon, and each of the grooves has an open top and a closed bottom. The radiating fins respectively have a heat-radiating zone and a bent zone being pressed to form an assembling section. The bent zones are perpendicular to the heat-radiating zones and are positioned on the open tops of the grooves with the assembling sections correspondingly fitted in the grooves.

To achieve the above and other objects, the heat-dissipation unit manufacturing method according to the present invention includes the following steps:

providing a base having a plurality of grooves formed on a top thereof, and each of the grooves having an open top and a closed bottom;

providing a plurality of radiating fins, each of which having a heat-radiating zone and a bent zone perpendicular to the heat-radiating zone; and flatly positioning the bent zones on the open tops of the grooves; and applying a pressure onto the bent zones, so that the bent zones respectively form an assembling section in the grooves to tightly fit therein, bringing the radiating fins to lock to the base.

With the heat-dissipation unit manufacturing method of the present invention, the bent zones are pressed to respectively form an assembling section for correspondingly tightly fitting in the grooves, allowing the radiating fins to be stably and firmly lock to the base. In addition, the cost of welding the radiating fins to the base as required in the conventional heat-dissipation unit is saved and the problem of a deformed base can be avoided.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
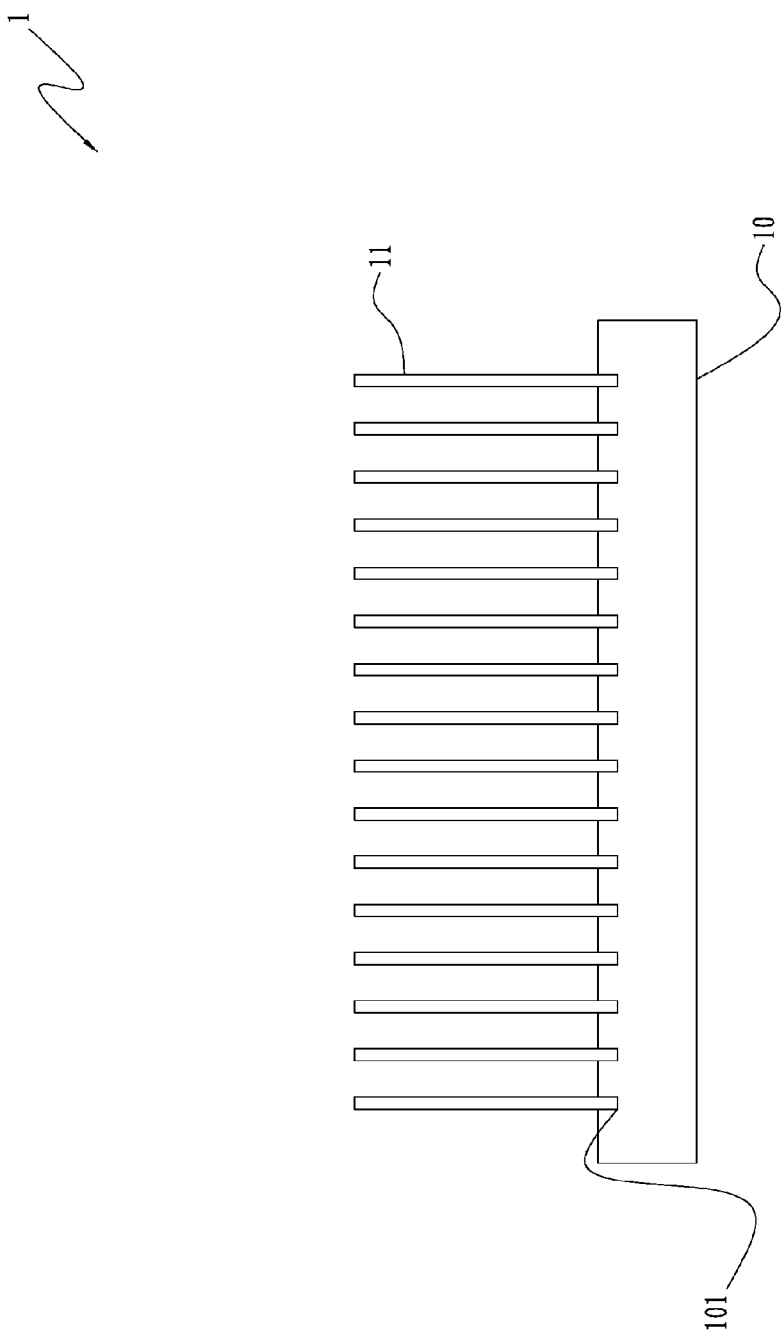
FIG. 1A is a sectional view showing the forming of a first conventional heat-dissipation unit.
Figure 1B:
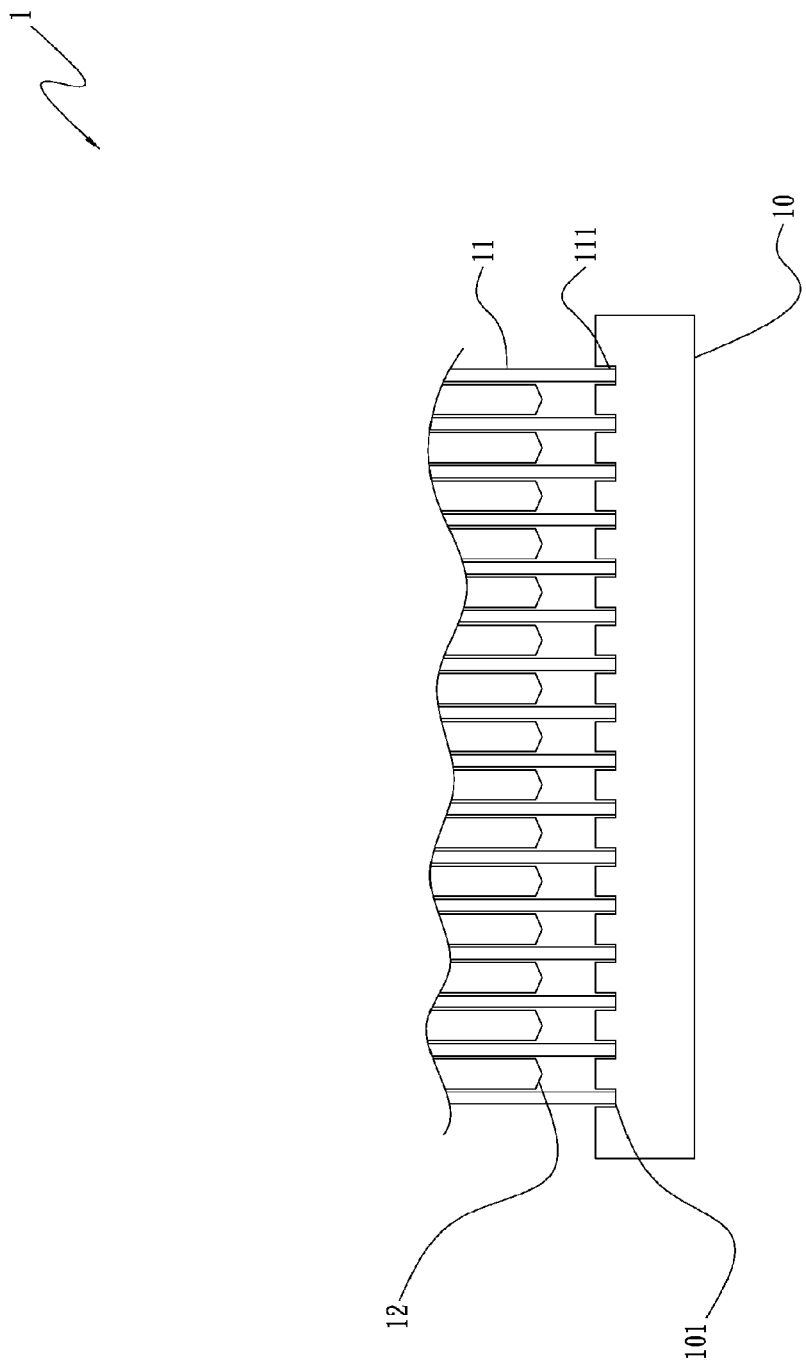
FIGS. 1B and 1C are sectional views showing the forming of a second conventional heat-dissipation unit.
Figure 1C:
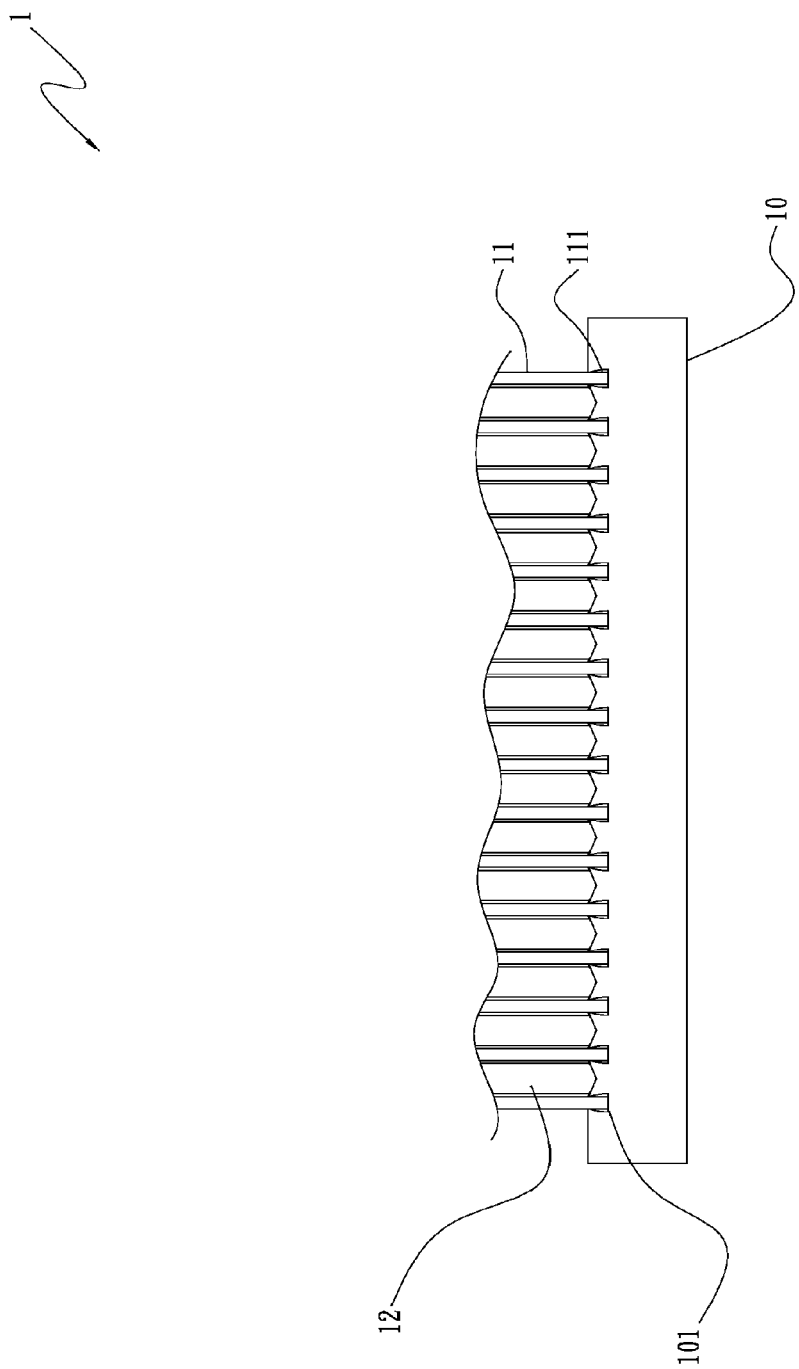

The present invention will now be described with some preferred embodiments thereof and with reference to the accompanying drawings. For the purpose of easy to understand, elements that are the same in the preferred embodiments are denoted by the same reference numerals.

Figure 2A:
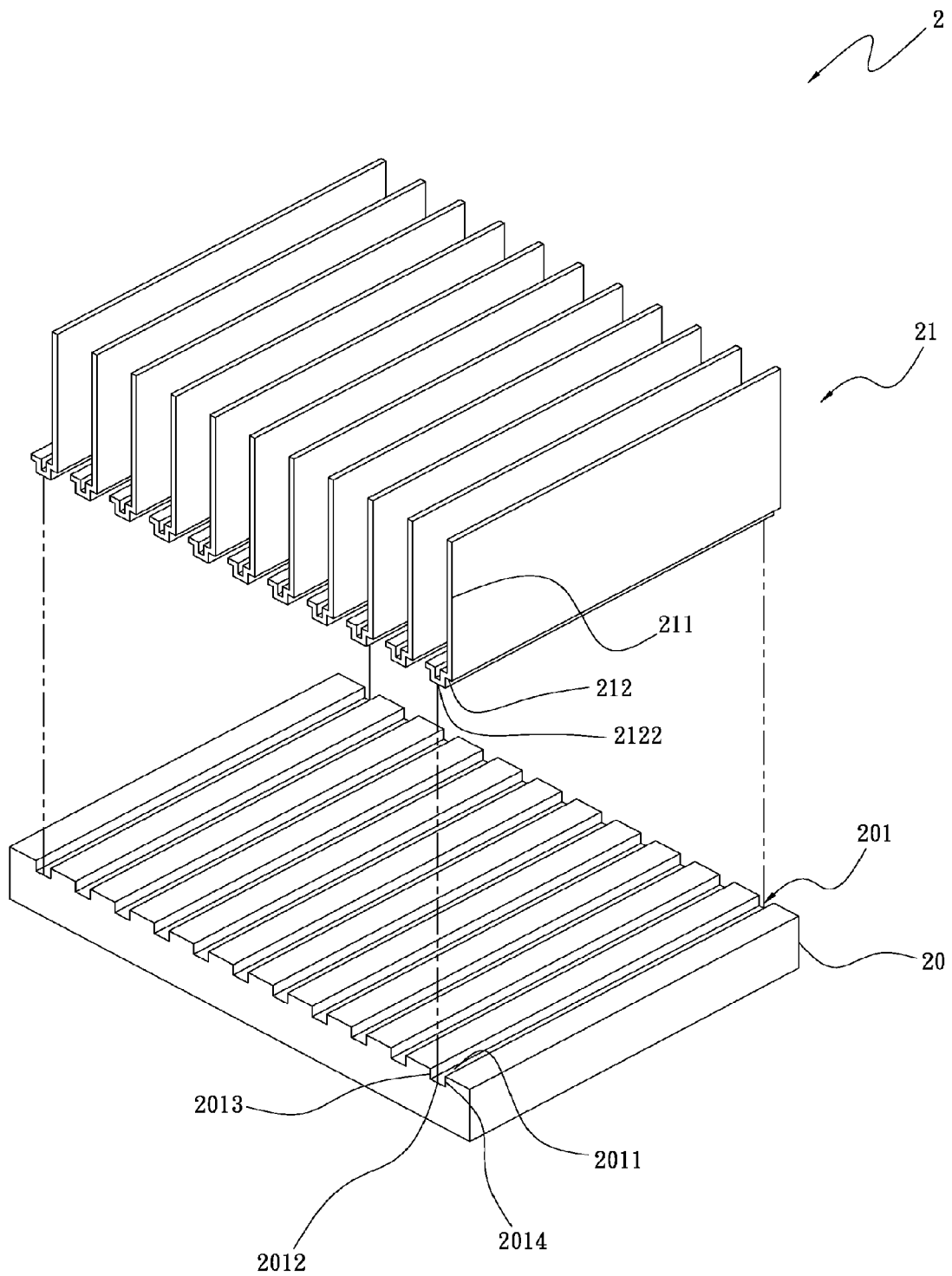
FIG. 2A is an exploded perspective view of a heat-dissipation unit according to a first embodiment of the present invention.
Figure 2B:
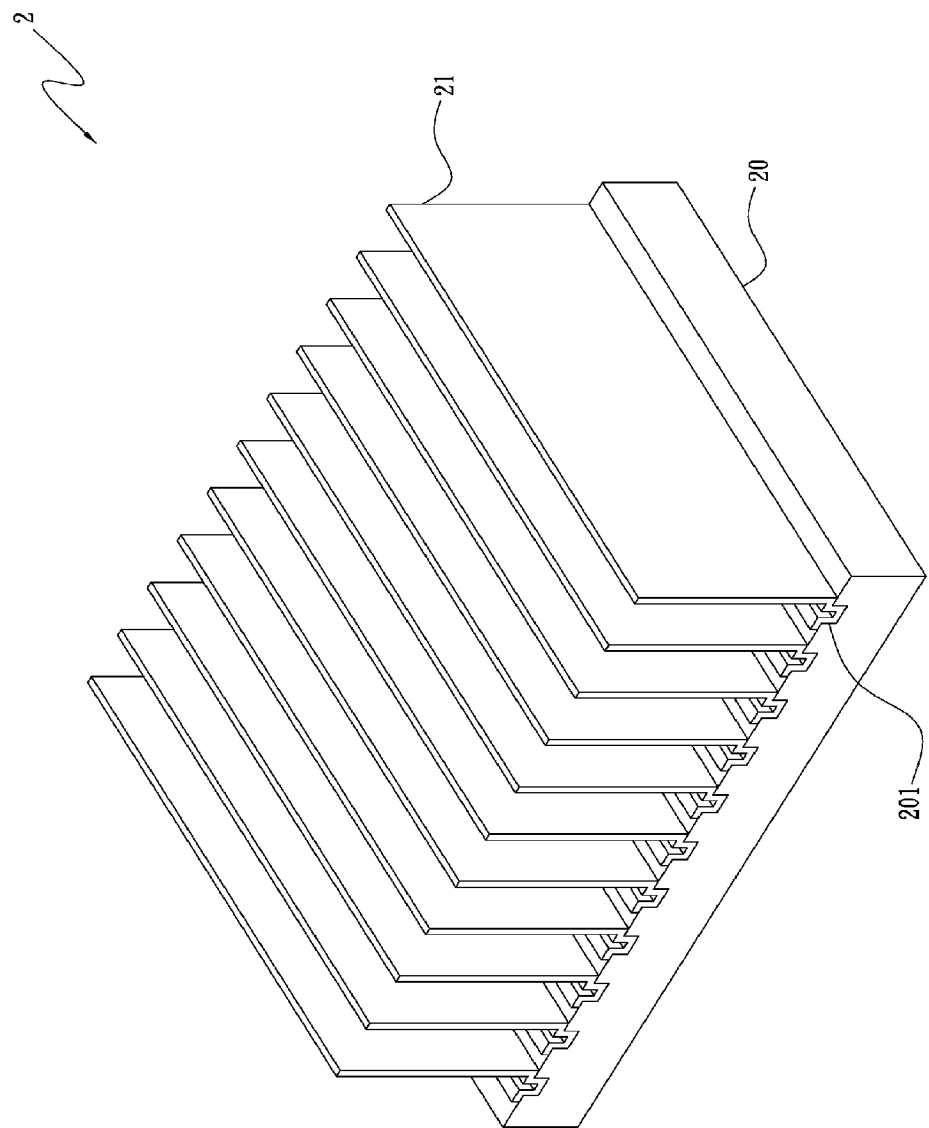
FIG. 2B is an assembled view of FIG. 2A.

Please refer to FIGS. 2A and 2B that are exploded and assembled perspective views, respectively, of a heat-dissipation unit 2 according to a first embodiment of the present invention. As shown, the heat-dissipation unit 2 includes a base 20 and a plurality of radiating fins 21. The base 20 is formed on a top with a plurality of grooves 201, each of which has an open top 2011, a closed bottom 2012, a first lateral side 2013, and a second lateral side 2014. The first and second lateral sides 2013, 2014 are separately raised from two opposite lateral edges of the closed bottom 2012.

Each of the radiating fins 21 includes a heat-radiating zone 211 and a bent zone 212. The bent zone 212 is perpendicular to the heat-radiating zone 211 and forms an assembling section 2122 in a sunken form. To assemble the radiating fins 21 to the base 20, the bent zones 212 are positioned corresponding to the open tops 2011 of the grooves 201 and the sunken assembling sections 2122 are correspondingly tightly fitted in the grooves 201.

As can be seen from FIG. 2B, with the structural design of the heat-dissipation unit 2 according to the first embodiment of the present invention, the sunken assembling sections 2122 are tightly fitted in the grooves 201 for the radiating fins 21 to stably and firmly position in place on the base 20. Further, the cost of welding the radiating fins to the base as required in the conventional heat-dissipation unit can be omitted, and the problem of a deformed and damaged base can be avoided.

Figure 3:
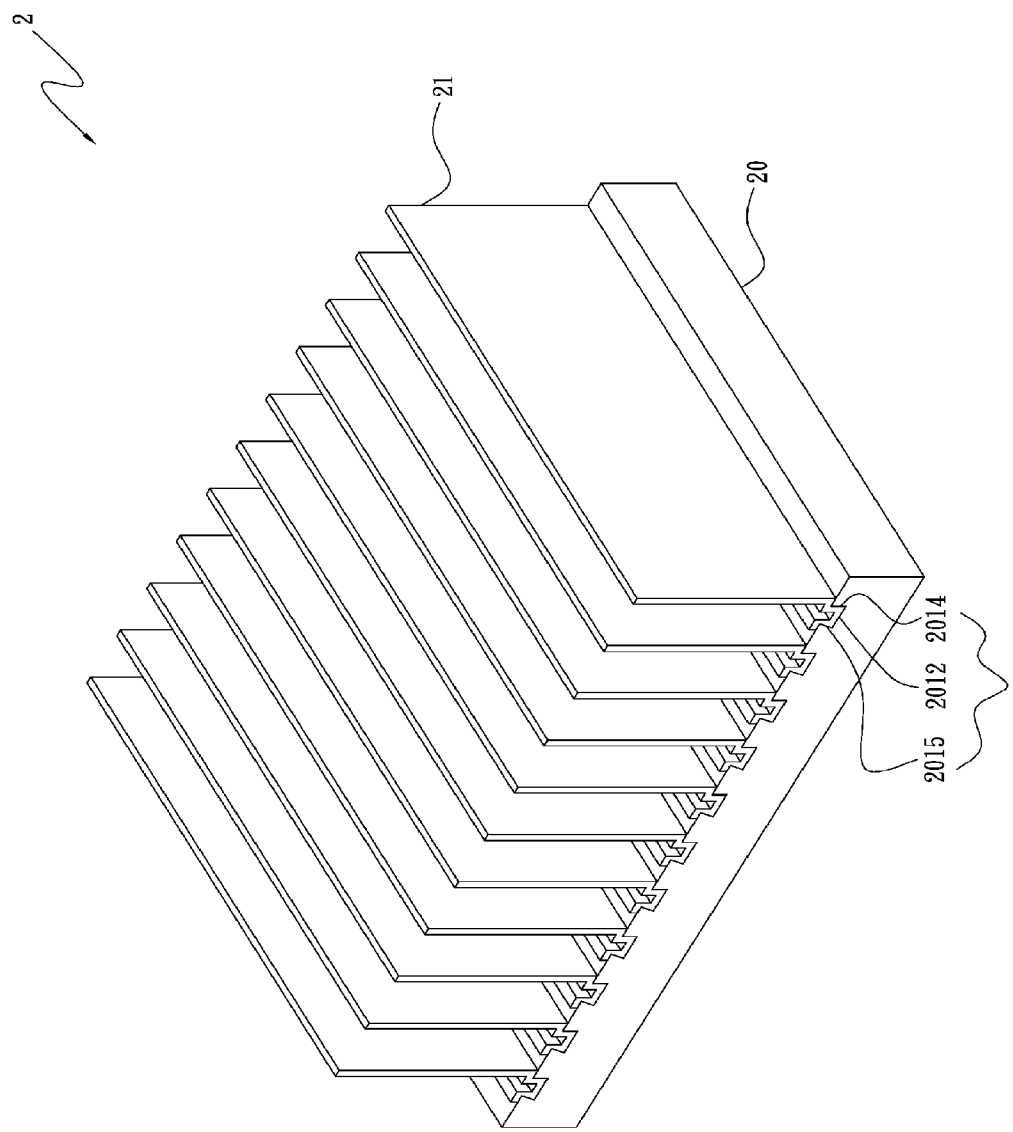
FIG. 3 is an assembled perspective view of a heat-dissipation unit according to a second embodiment of the present invention.

FIG. 3 is an assembled perspective view of a heat-dissipation unit 2 according to a second embodiment of the present invention. Please refer to FIG. 3 along with FIG. 2A. As shown, the heat-dissipation unit 2 in the second embodiment is generally structurally similar to the first embodiment, except that, in the second embodiment, each of the grooves 201 has at least one inward and downward inclined zone 2015, which can be formed on the first lateral side 2013 or the second lateral side 2014. In the illustrated second embodiment, the inclined zone 2015 is formed on the first lateral side 2013 without being limited thereto. That is, the inclined zone 2015 can be otherwise formed on the second lateral side 2014. The inclined zone 2015 formed on the first lateral side 2014 is inclined toward the second lateral side 2014, and the assembling section 2122 is bent in a manner for correspondingly and fitly bearing on the inclined zone 2015 in the groove 201. With the assembling section 2122 fitly bearing on the inclined zone 2015, the closed bottom 2012, and the first lateral side 2013 or the second lateral side 2014, each of the radiating fins 21 can be similarly firmly assembled to the base 20.

Figure 4:
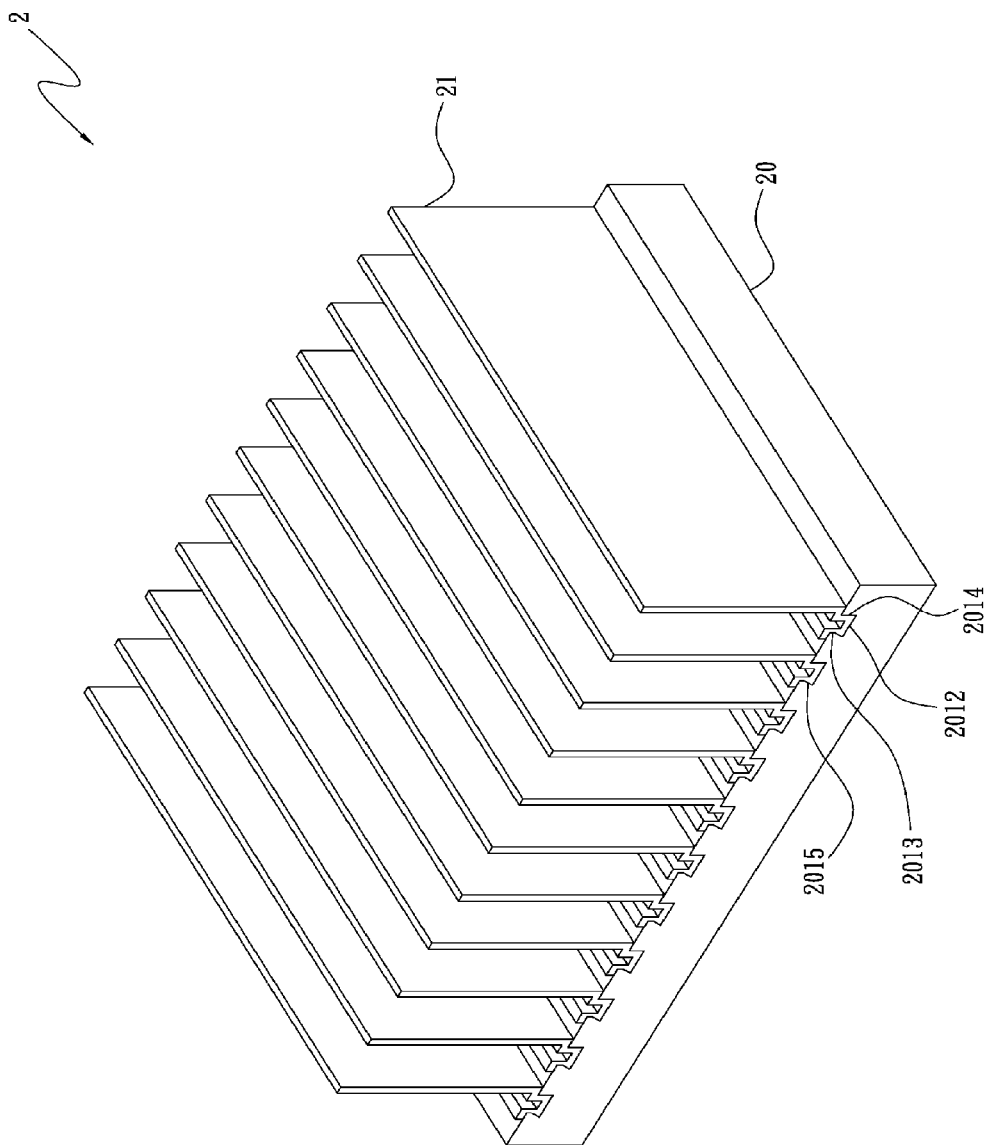
FIG. 4 is an assembled perspective view of a heat-dissipation unit according to a third embodiment of the present invention.

FIG. 4 is an assembled perspective view of a heat-dissipation unit 2 according to a third embodiment of the present invention. As shown, the heat-dissipation unit 2 in the third embodiment is generally structurally similar to the previous embodiments, except that, in the third embodiment, each of the grooves 201 has at least one inward and downward inclined zone 2015 formed on a part of the first lateral side 2013 or the second lateral side 2014. In the illustrated third embodiment, the inclined zone 2015 is formed on a part of the first lateral side 2013 without being limited thereto. That is, the inclined zone 2015 may be otherwise formed on a part of the second lateral side 2014. With the assembling section 2122 fitly bearing on the inclined zone 2015, the closed bottom 2012, and the first lateral side 2013 and the second lateral side 2014, each of the radiating fins 21 can be similarly firmly assembled to the base 20.

Figure 5A:
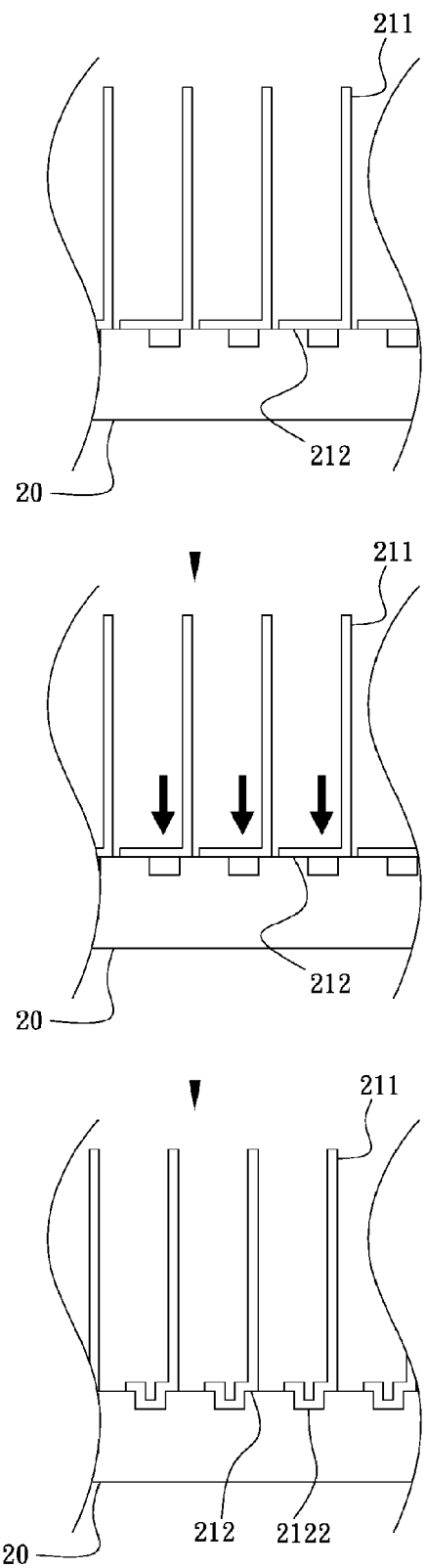
FIG. 5A is an illustrative view showing the steps included in a first embodiment of a heat-dissipation unit manufacturing method according to the present invention.
Figure 5B:
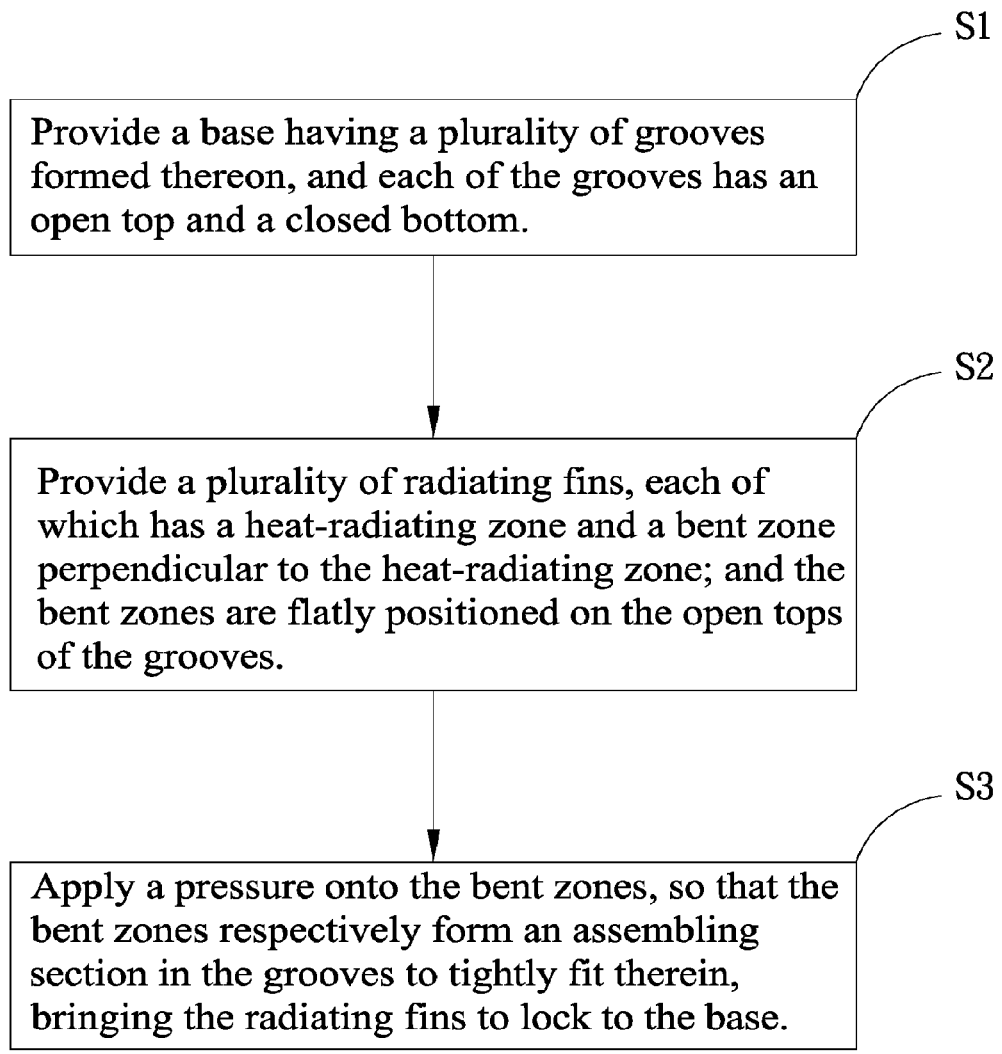
FIG. 5B is a flowchart showing the steps included in the first embodiment of the heat-dissipation unit manufacturing method according to the present invention.

FIGS. 5A and 5B are an illustrative view and a flowchart, respectively, showing the steps S1, S2 and S3 included in a first embodiment of a heat-dissipation unit manufacturing method according to the present invention.

In the step S1, a base having a plurality of grooves formed thereon is provided; and each of the grooves has an open top and a closed bottom.

More specifically, a base 20 having a plurality of grooves 201 formed thereon is provided, and each of the grooves 201 has an open top 2011 and a closed bottom 2012.

In the step S2, a plurality of radiating fins are provided, and each of which includes a heat-radiating zone and a bent zone perpendicular to the heat-radiating zone; and the bent zones are flatly positioned on the open tops of the grooves.

More specifically, a plurality of radiating fins 21 are provided, and each of which includes a heat-radiating zone 211 and a bent zone 212 perpendicular to the heat-radiating zone 211; and the bent zones 212 are flatly positioned on the open tops 2011 of the grooves 201.

In the step S3, a pressure is applied onto all the bent zones, so that the bent zones respectively form a sunken assembling section in the grooves to tightly fit therein, so that the radiating fins are locked to the base.

More specifically, a pressure is applied onto all the bent zones 212, so that the bent zones 212 respectively form a sunken assembling section 2122 in the grooves 201 to tightly fit therein, so that the radiating fins 21 are locked to the base 20.

The bent zones 212 are pressed to form the assembling sections 2122 via mechanical process. In the illustrated embodiment, the mechanical process is stamping without being limited thereto.

Figure 6:
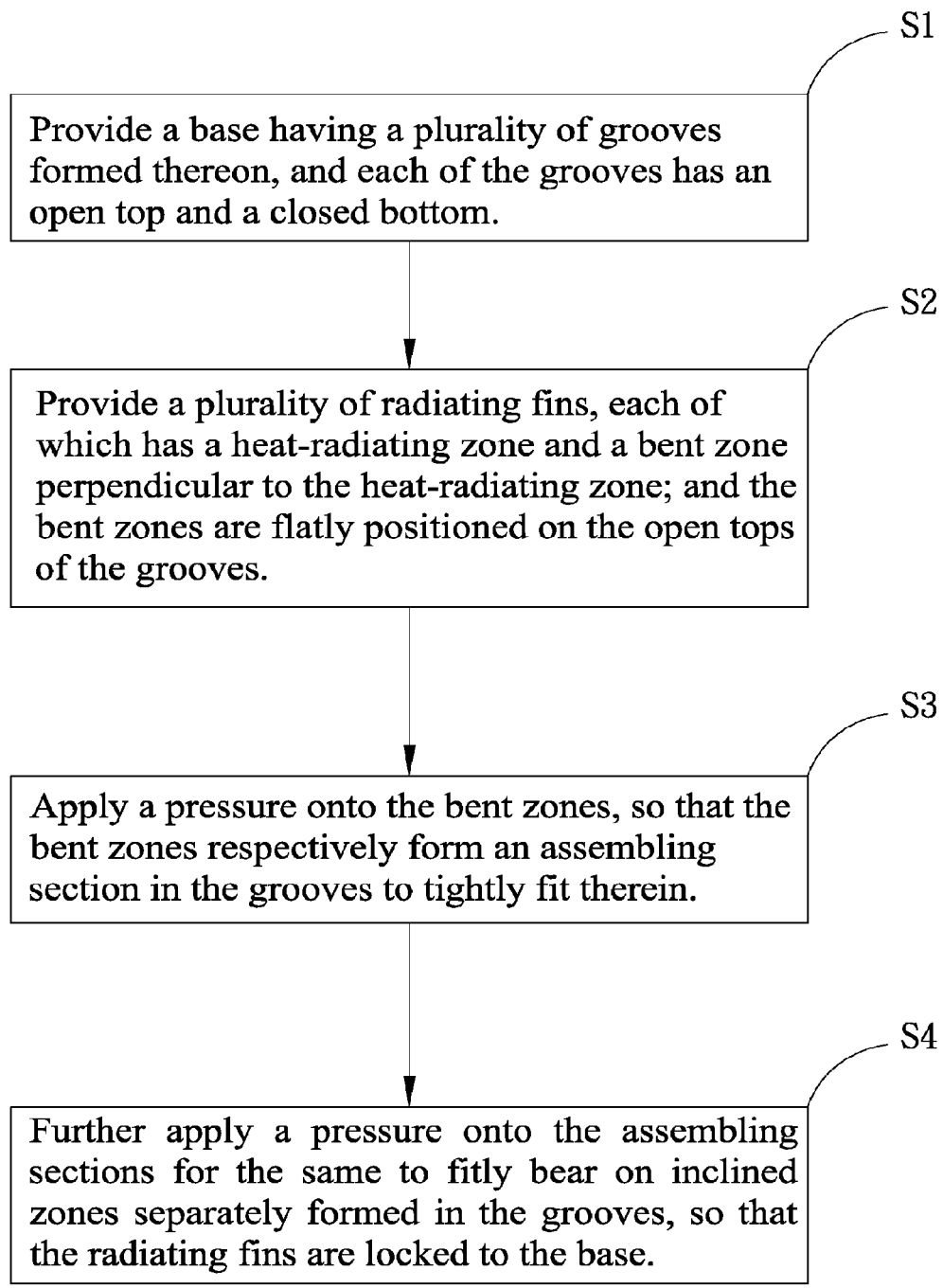
FIG. 6 is a flowchart showing the steps included in a second embodiment of the heat-dissipation unit manufacturing method according to the present invention.

FIG. 6 is a flowchart showing the steps S1 to S4 included in a second embodiment of the heat-dissipation unit manufacturing method according to the present invention.

In the step S1, a base having a plurality of grooves formed thereon is provided; and each of the grooves has an open top and a closed bottom.

In the step S2, a plurality of radiating fins are provided, and each of which includes a heat-radiating zone and a bent zone perpendicular to the heat-radiating zone; and the bent zones are flatly positioned on the open tops of the grooves.

In the step S3, a pressure is applied onto all the bent zones, so that the bent zones respectively form a sunken assembling section in the grooves to tightly fit therein.

While the second embodiment of the heat-dissipation unit manufacturing method includes steps S1 to S3 the same as those in the first embodiment, the second embodiment further includes a step S4 after the step S3.

In the step S4, a pressure is further applied onto the assembling sections for the same to fitly bear on inclined zones separately formed in the grooves, so that the radiating fins are locked to the base.

More specifically, a pressure is further applied onto the assembling sections 2122 for the same to fitly bear on inclined zones 2015 separately formed in the grooves 201, so that the radiating fins 21 are firmly locked to the base 20.

With the heat-dissipation unit manufacturing method of the present invention, the bent zones 212 are pressed by way of stamping to respectively form a sunken assembling section 2122 for correspondingly tightly fitting in the grooves 201, allowing the radiating fins 21 to be stably and firmly locked to the base 20. In addition, the cost of welding the radiating fins to the base as required in the conventional heat-dissipation units is saved and the problem of a deformed or damaged base can be avoided.

In brief, the present invention is superior to the prior art due to the following advantages: (1) providing more stable and firmer structure; (2) requiring only reduced manufacturing cost; and (3) avoiding the problem of a deformed base.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of manufacturing heat-dissipation unit, comprising the steps of:
   providing a base having a plurality of grooves formed thereon, and each of the grooves having an open top and a closed bottom;
   providing a plurality of radiating fins, each of which having a heat-radiating zone and a bent zone perpendicular to the heat-radiating zone, and flatly positioning the bent zones on the open tops of the grooves; and
   applying a pressure onto the bent zones, so that the bent zones respectively form an assembling section recessed in the grooves to tightly fit therein, bringing the radiating fins to lock to the base; wherein the assembling sections are tightly fitted in the grooves through a mechanical process, and the mechanical process is stamping.

2. The heat-dissipation unit manufacturing method as claimed in claim 1, wherein each of the grooves further has a first lateral side and a second lateral side, which being correspondingly raised from two lateral edges of the closed bottom of the groove.

3. The heat-dissipation unit manufacturing method as claimed in claim 2, wherein each of the grooves further has at least one inward and downward inclined zone.

4. The heat-dissipation unit manufacturing method as claimed in claim 3, wherein the inclined zone is formed on at least one of the first lateral side and the second lateral side of the groove.

5. The heat-dissipation unit manufacturing method as claimed in claim 4, further comprising a step after the step of forming the assembling sections to further apply a pressure onto the assembling sections for the same to fitly bear on the inclined zones, so that the radiating fins are firmly locked to the base.

\* \* \* \* \*